Jan. 5, 1971 L. WERNER ET AL 3,553,036

PRODUCTION OF DOPED ZONES IN SEMICONDUCTOR BODIES

Filed Oct. 11, 1966

INVENTORS
Werner Langheinrich &
Max Kuisl

BY Spencer & Kaye
ATTORNEYS

United States Patent Office 3,553,036

Patented Jan. 5, 1971

3,553,036

PRODUCTION OF DOPED ZONES IN SEMICONDUCTOR BODIES

Werner Langheinrich, Ulm (Danube), and Max Kuisl, Bellenberg, Germany, assignors to Telefunken Patentverwertungsgesellschaft m.b.H., Ulm (Danube), Germany Filed Oct. 11, 1966, Ser. No. 585,924
Claims priority, application Germany, Oct. 16, 1965, T 29,593
Int. Cl. H01l 7/44
U.S. Cl. 148—187 5 Claims

ABSTRACT OF THE DISCLOSURE

A method for producing doped zones in selected regions of one surface of a semiconductor body by the diffusion in of a selected impurity, the method being carried out by covering those regions in which doped zones are not to be formed with an oxidizing material which serves to oxidize the selected impurity so as to convert it into a nondiffusing substance, thereby permitting the selected impurity to diffuse into only the selected surface regions.

Figure 1:
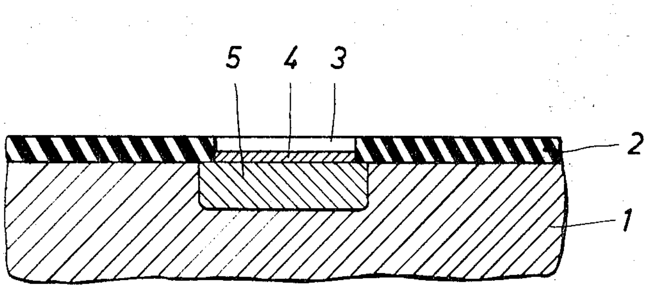

The present invention relates to the production of doped zones in semiconductor bodies, and particularly to the production of such zones by the diffusion of impurities into selected surface regions of such bodies.

Several techniques are already known in the semiconductor art for controlling the diffusion of impurities into selected surface regions of a semiconductor body by applying masking layers, which are generally constituted by an oxide, to the surface to be treated. According to a known planar technique, for example, a silicon semiconductor wafer, or body, is covered with a layer of $SiO_2$, by thermal oxidation, and small openings, or "windows," are subsequently formed in this layer by means of known photo-masking and etching techniques. When such a silicon wafer is exposed to an atmosphere containing $P_2O_5$ or $B_2O_3$, in either a pure or combined state, and the atmosphere is heated to a temperature of around 1000° C., the $P_2O_5$ or $B_2O_3$ is reduced by the silicon to elementary phosphorus or boron with an accompanying production of $SiO_2$ at the exposed surface regions of the semiconductor wafer. The doping impurity thus derived in elemental form at the exposed surface regions of the wafer which are not masked will then diffuse into the semiconductor wafer to produce a doped zone.

Since the size of each of the windows and the distance separating adjacent windows are made very small, a large number of individual semiconductor devices, each containing one or more doped zones, can be simultaneously produced on one semiconductor wafer in the manner described above.

Although the technique described above is well suited for use on silicon wafers, recent tests have shown that it can not be satisfactorily applied to other semiconductor materials such as germanium, for example. When one or more surfaces of such other semiconductor materials are covered with a layer of $SiO_2$, by pyrolysis or hydrolysis of silicon compounds for example, it has been found that the oxides, such as $Ga_2O_3$ or $In_2O_3$, from which the doping impurity is normally derived, will not be chemically reduced by the germanium. Therefore, it is not possible to directly produce doped zones of p-type conductivity simply by utilizing masking layers on semiconductor wafers when a material such as germanium is involved.

On the other hand, attempts to produce the doped zones in the exposed surface regions of a material such as germanium, which is covered with a masking layer of $SiO_2$ having openings which expose the surface regions to be doped, by exposing the wafer to an atmosphere containing the impurity in its elemental form, i.e., in the form of pure gallium or indium, have not met with success because the $SiO_2$ masking layer is not able to prevent the passage of a doping substance which is originally present in its elemental form. It thus results that such doping substance passes easily through such a masking layer and diffuses into the semiconductor wafer in the regions where such a diffusion is not to occur. If it is attempted to overcome this difficulty by providing a relatively thick masking layer on the semiconductor wafer, new problems will arise because strong mechanical forces will develop in the thick layer during subsequent fabrication processes and will tend to produce cracks or breaks in the masking layer.

It will be readily appreciated that the lack of a satisfactory technique for creating such doped zones in semiconductor materials of the type exemplified by germanium has severely limited the development of semiconductor devices based on such materials.

It is therefore a primary object of the present invention to overcome these drawbacks.

Another object of the present invention is to provide a novel method for producing doped zones in semiconductor wafers made of materials such as germanium.

Another object of the present invention is to eliminate the drawbacks inherent in prior art techniques for diffusing impurities into wafers made of such materials.

A further object of the present invention is the provision of a novel semiconductor structure which permits the ready production of doped zones in selected surface regions of a semiconductor body forming a part of the structure.

These and other objects according to the present invention are achieved by a method of treating a semiconductor body at least one surface of which is partitioned into at least one surface region and at least one second surface region, for permitting at least one doped zone to be produced by the diffusion in of a selected impurity. This method is carried out by covering only each second surface region with a material which prevents such impurity from diffusing into the surface by oxidizing the impurity to convert it into a nondiffusing substance, for permitting such impurity to diffuse only into, and to form a doped zone in, each first surface region.

The method of the present invention also includes the preliminary step of covering the at least one surface of the semiconductor body with an insulating layer which has an opening coextensive with each first surface region for exposing the first surface regions.

The present invention also includes, as an intermediate product in the manufacture of semiconductor elements, a semiconductor structure including a semiconductor body, an insulating layer, and a diffusion-controlling layer. The semiconductor body has at least one surface partitioned into a first surface component and a second surface component, each component being constituted by at least one surface region. The insulating layer is disposed on the at least one surface for covering the surface regions of the second component and has an opening adjacent each surface region of the first component for exposing each such surface region. Finally, the diffusion-controlling layer is disposed above one of the surface components for permitting a selected impurity to diffuse only into, and to form a doped zone in, each surface region of the first component.

According to a first specific embodiment of the present invention, the layer made of a material for permitting the selected impurity to diffuse into each surface region of the first component is constituted by a chemical reducing material and is applied directly to each surface region of the first component. In this case, the impurity is originally present in combination as an oxide which is reduced by the reducing material so as to yield the impurity in its elemental form, which impurity then diffuses into each surface region of the first component.

According to another embodiment of the present invention, the diffusion-controlling layer for permitting such a diffusion only into the surface regions of the first component is constituted by an oxidizing layer disposed above only the second surface regions, and the impurity is originally present in its elemental form. The impurity is thus permitted to diffuse directly into the exposed first surface regions and is oxidized by the oxidizing layer covering the second surface regions so as to be prevented from diffusing into the latter surface regions.

Figure 2:
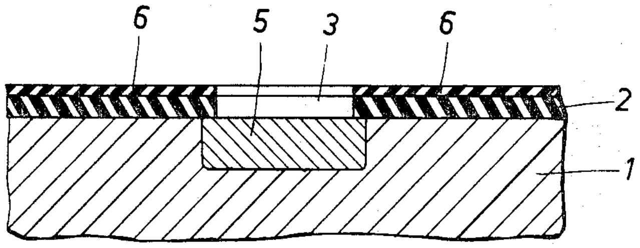

Additional objects and advantages of the present invention will become apparent upon consideration of the following description when taken in conjunction with the accompanying drawings in which:

FIG. 1 is an elevational, cross-sectional view of a semiconductor element illustrating one embodiment of the method according to the present invention, FIG. 2 is a view similar to that of FIG. 1 illustrating another embodiment of the method of the present invention.

Referring first to FIG. 1, there is shown a portion of a semiconductor wafer, or body 1, which may be of germanium, for example, and which, according to the method of the present invention, has at least one surface covered with an insulating layer 2, of $SiO_2$ for example, by means of pyrolysis or hydrolysis. Then, openings, or "windows," 3 are formed in the insulating layer 2, for example by means of known photo-masking and etching techniques. Only one such window is shown in the drawing, although it will be readily appreciated that any number of windows can be provided. The windows 3 divide the at least one surface into at least one first surface region, each of which is exposed by a window 3, and at least one second surface region, all of which second regions are covered by layer 2.

Subsequently, a layer of a reducing substance is deposited on surface regions of body 1 which are exposed by the windows 3. This may be accomplished, for example, by vaporizing a layer of a metal such as aluminum, tin or titanium, for example onto the entire surface of the insulating layer 2 and the surface regions of body 1 which are exposed by the windows 3, and by subsequently removing the portions of the metal layers from the insulating layer 2. This removal may be carried out by known photomasking and etching techniques so as to leave only the metal layer portions which are disposed in windows 3 and thus directly on the exposed surface regions of body 1. This removal of the metal layer from insulating layer 2 can be carried out either chemically or electrochemically, or even mechanically in those cases where the adhesive qualities of the metal are such that it can be easily removed from the insulating layer while adhering securely to the semiconductor body 1.

It is also possible, according to the present invention, to initially apply the reducing substance only in the region of each of the windows 3 so as to simplify the subsequent removal process.

In accordance with a further feature of the present invention, it is also possible to provide an oxide layer in each opening 3 between the reducing substance layer 4 and the surface of the semiconductor body in order to permit the subsequently applied input substance to be diffused through the oxide layer into the semiconductor body.

The resulting arrangement, with or without the last-mentioned oxide layer, is then exposed to a medium containing the doping substance, which may be present in the form of an oxide such as $Ga_2O_3$ or $In_2O_3$, for example; and is subjected to an elevated temperature. Under these conditions, the oxide is reduced in the layer 4 due to the chemical reaction occurring between the oxide and the material constituting layer 4. One of the products of this reaction will be the elemental impurity, such as gallium or indium for example, which will diffuse into the semiconductor body 1 to form a doped zone 5 adjacent each of the windows 3.

The method of the present invention thus permits the doping to be controlled in such a way that doped zones will be produced in the semiconductor body only at those spots where a reducing layer 4 is present.

The method illustrated in FIG. 1 presents the additional advantage that after each of the doped zones has been produced, the reducing layer 4 adjacent each zone can be subsequently employed as an ohmic contact for connecting an external lead to the resulting semiconductor arrangement.

According to a further advantage presented by the method illustrated in FIG. 1, the covering of each exposed surface portion of body 1 with a reducing layer 4 serves to protect the sensitive surface of the semiconductor body during subsequent fabrication processes, thereby assuring that a uniform diffusion front will be created during the sbsequent diffusion-in process.

Turning now to FIG. 2, there is shown an arrangement for carrying out a modified version of the process according to the present invention. According to this process, the semiconductor body 1 is again covered with an insulating layer 2. Then, however, the insulating layer 2 is covered with an oxidizing layer 6, which may be constituted by $SiO_2$ mixed with a suitable oxidizing substance, for example. Such oxidizing substances are generally constituted by oxides, such as $PbO_2$, $Sb_2O_3$, or $As_2O_5$ for example.

The layer 2 may be deposited, for example, by the hydrolysis or pyrolysis of $SiCl_4$ to create a layer of pure $SiO_2$. Then the layer 6 can be deposited by the hydrolysis of a mixture of $SiCl_4$ and $PbCl_4$ to produce a layer of $SiO_2$ having $PbO_2$ distributed therein.

The resulting layers 2 and 6 are then provided with windows 3 in any suitable, well-known manner. Subsequently, the semiconductor arrangement is exposed to a medium, which is preferably gaseous, containing the doping substance, which this time is originally present in its elemental form, as pure gallium or pure indium for example. This doping substance diffuses through the windows 3 and, when the temperature of the arrangement is raised to a suitable level, diffuses into the semiconductor body 1 to form the doped zones 5.

This diffusion into the semiconductor body 1 only takes place through the windows 3 because the oxidizing layer 6 prevents the impurity from diffusing into the other regions of the semiconductor body by converting the impurity into an oxide which is incapable of penetrating the surface of the semiconductor body.

This embodiment of the process of the present invention is particularly advantageous when it is desired to carry out two successive diffusions of different doping substances into each exposed region of the semiconductor body.

It will be understood that the above description of the present invention is susceptible to various modifications, changes, and adaptations, and the same are intended to be comprehended within the meaning and range of equivalents of the appended claims.

What is claimed is:

1. A method of treating a semiconductor body at least one surface of which is partitioned into at least one first surface region and at least one second surface region, to cause at least one doped zone to be produced by the diffusion in of a selected impurity of either gallium or indium, comprising: covering the at least one surface of the semiconductor body with an insulating layer; covering the insulating layer with a layer of material, constituted by $SiO_2$ and containing an oxidizing substance constituted by $PbO_2$, $Sb_2O_3$ or $As_2O_5$, which material oxidizes the impurity and converts it into a substance which will not diffuse into the surface of said semiconductor body; providing openings in both of said layers for exposing each said first surface region, and exposing the resulting arrangement to an atmosphere containing such selected impurity, whereby the impurity diffuses only into, and forms a doped zone in, each said first surface region and is prevented from diffusing into each side second surface region.

2. A method as defined in claim 1 wherein the semiconductor body is constituted by a germanium or silicon wafer and the insulating layer is made of $SiO_2$.

3. A method as defined in claim 1 wherein the impurity contained in the atmosphere is constituted by gallium or indium in elemental form.

4. A method as defined in claim 1 comprising the further step of subjecting the arrangement to an elevated temperature while it is exposed to the atmosphere for facilitating the diffusion.

5. A method of treating a semiconductor body as defined in claim 1 wherein: said insulating layer is formed by converting $SiCl_4$ into $SiO_2$; and wherein said material which contains an oxidizing substance is formed by converting a gaseous mixture of $SiCl_4$ and $PbCl_4$ into a solid layer of $SiO_2$ containing $PbO_2$ as the oxidizing substance.

References Cited

UNITED STATES PATENTS

| | | | |
|---|---|---|---|
| 3,183,129 | 5/1965 | Tripp | 148—186 |
| 3,275,910 | 9/1966 | Phillips | 148—187UX |
| 3,310,442 | 3/1967 | Winstel et al. | 148—187 |
| 3,347,719 | 10/1967 | Heywang | 148—187 |
| 2,802,760 | 8/1957 | Derick et al. | 148—187 |
| 3,408,238 | 10/1968 | Sanders | 148—190 |

L. DEWAYNE RUTLEDGE, Primary Examiner

R. A. LESTER, Assistant Examiner

UNITED STATES PATENT OFFICE

CERTIFICATE OF CORRECTION

Patent No. 3,553,036 Dated January 5th, 1971

Inventor(s) Werner Langheinrich and Max Kuisl

It is certified that error appears in the above-identified patent and that said Letters Patent are hereby corrected as shown below:

In the heading of the drawing sheet, change patentee's name to --W. Langheinrich et al--.

Column 4, line 4 change "gallum" to --gallium--. Column 5, line 9, change "side" to --said--.

Signed and sealed this 13th day of July 1971.

(SEAL)
Attest:

EDWARD M.FLETCHER, JR.
Attesting Officer

WILLIAM E. SCHUYLER, J
Commissioner of Patent